United States Patent
Tamura et al.

(10) Patent No.: US 9,273,389 B2
(45) Date of Patent: Mar. 1, 2016

(54) CU—IN—GA—SE QUATERNARY ALLOY SPUTTERING TARGET

(75) Inventors: Tomoya Tamura, Ibaraki (JP); Hideo Takami, Ibaraki (JP); Masaru Sakamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 240 days.

(21) Appl. No.: 13/820,821

(22) PCT Filed: Apr. 28, 2011

(86) PCT No.: PCT/JP2011/060347
§ 371 (c)(1),
(2), (4) Date: Mar. 5, 2013

(87) PCT Pub. No.: WO2012/042959
PCT Pub. Date: Apr. 5, 2012

(65) Prior Publication Data
US 2013/0168241 A1    Jul. 4, 2013

(30) Foreign Application Priority Data
Sep. 27, 2010    (JP) .................................. 2010-214738

(51) Int. Cl.
| C23C 14/35 | (2006.01) |
| C23C 14/14 | (2006.01) |
| H01J 37/34 | (2006.01) |
| C23C 14/06 | (2006.01) |
| C23C 14/34 | (2006.01) |

(52) U.S. Cl.
CPC ............. *C23C 14/14* (2013.01); *C23C 14/0623* (2013.01); *C23C 14/3414* (2013.01); *H01J 37/3426* (2013.01)

(58) Field of Classification Search
CPC ................................................ H01J 37/3426
USPC ........................................ 204/298.12, 298.13
See application file for complete search history.

(56) References Cited

U.S. PATENT DOCUMENTS

| 2007/0099332 A1* | 5/2007 | Kardokus et al. ............... 438/95 |
| 2012/0205242 A1 | 8/2012 | Tamura et al. |
| 2013/0319527 A1 | 12/2013 | Tamura et al. |
| 2014/0001039 A1 | 1/2014 | Tamura et al. |

FOREIGN PATENT DOCUMENTS

| CN | 101245443 A | 8/2008 |
| CN | 101260513 A | 9/2008 |
| CN | 101397647 A | 4/2009 |
| CN | 101519764 A | 9/2009 |
| CN | 101667610 A | 3/2010 |
| JP | 2008-138232 A | 6/2008 |
| JP | 2008-163367 A | 7/2008 |
| JP | 2009-203499 A | 9/2009 |
| JP | 2009-287092 A | 12/2009 |
| TW | 200832727 A | 8/2008 |

OTHER PUBLICATIONS

C. Suryanarayana et al., One page Abstract of "Synthesis and processing of a Cu—In—Ga—Se Sputtering Target", Thin Solid Films, vol. 332, No. 1, pp. 340-344, 1998 (month unknown).
Z. Ning et al., One page Abstract of "An investigation on preparation of CIGS targets by sintering process", Materials Science and Engineering B, vol. 166, pp. 34-40, Jan. 15, 2010.
Takahiro Unno et al., "Kagobutsu Taiyo Denchi-yo Sputter Target/ Manufacturing Technology of Compound Semiconductor and Application Device", Electronic Materials and Parts, pp. 42-44, (English translation of first full paragraph of p. 43 & Fig. 1), Nov. 2009.
Zhang Ning et al., "An Investigation on Preparation of CIGS Targets by Sintering Process", Materials Science and Engineering B, vol. 166, pp. 34-40, Jan. 15, 2010.
Suryanarayana et al, "Synthesis and processing of a Cu—In—Ga— Se sputtering target", Thin Solid Films 332, pp. 340-344, 1998 (month unknown).

* cited by examiner

*Primary Examiner* — Jason M Berman
(74) *Attorney, Agent, or Firm* — Howson & Howson LLP

(57) ABSTRACT

A quaternary alloy sputtering target composed of copper (Cu), indium (In), gallium (Ga) and selenium (Se), wherein a composition ratio of the respective elements is represented by a formula of $Cu_xIn_{1-y}Ga_ySe_a$ (in the formula, $0.84 \leq x \leq 0.98$, $0 < y \leq 0.5$, $a = (1/2)x + 3/2$), and a structure observed via EPMA is configured only from a $Cu(In, Ga)Se_2$ phase without any heterogenous phase of $Cu_2Se$ or $Cu(In, Ga)_3Se_5$. Provided is a CIGS quaternary alloy sputtering target which is subject to hardly any abnormal discharge even when sputtered for a long period, which is free of any heterogenous phase of $Cu_2Se$ or $Cu(In, Ga)_3Se_5$ which causes the deterioration in the conversion efficiency of the film after being sputter-deposited, and which can produce a film having superior in-plane uniformity. Additionally provided is a CIGS quaternary alloy sputtering target having a predetermined bulk resistance and a high density.

8 Claims, No Drawings

CU—IN—GA—SE QUATERNARY ALLOY SPUTTERING TARGET

BACKGROUND

The present invention relates to a Cu—In—Ga—Se (hereinafter referred to as "CIGS" where appropriate) quaternary alloy sputtering target that is used upon forming a CIGS quaternary alloy thin film to become a light-absorbing layer of thin-film solar cells.

In recent years, the technical development of CIGS-based solar cells with high conversion efficiency for use as thin-film solar cells has advanced. As a method of producing the light-absorbing layer of such thin-film solar cells, the vapor-deposition technique and the selenization method are known. Nevertheless, the solar cells produced via the vapor-deposition technique are advantageous of having high conversion efficiency, but have drawbacks; namely, low deposition rate, high cost, and low productivity.

Meanwhile, the selenization method is suitable for industrial mass production, but a complex and dangerous process of performing heat treatment and selenization in a selenium hydride atmosphere gas is required after preparing a laminated film of Cu—Ga and In, and there are drawbacks in terms of cost and time.

Thus, attempts are being made for preparing a CIGS quaternary alloy light-absorbing layer in a single sputtering process by using a CIGS quaternary alloy sputtering target. At present, a CIGS quaternary alloy sputtering target suitable for forming a light-absorbing layer has not yet been achieved.

Patent Document 1 discloses a method of producing a CIGS quaternary alloy sputtering target by: using a Cu molten metal as the starting material; adding Se thereto to prepare a Cu—Se-based binary alloy molten metal; subsequently placing In therein to prepare a Cu—Se—In alloy molten metal; thereafter placing Ga therein to prepare a Cu—Se—In—Ga alloy molten metal; solidifying this to form a CIGS quaternary alloy ingot; thereafter subjecting the ingot to dry grounding; and then hot-pressing the pulverized powder.

Nevertheless, with the CIGS quaternary alloy sputtering target obtained based on the foregoing production method, Patent Document 1 fails to clarify the target structure, film characteristics after being deposited, density, oxygen concentration, and other matters which are issues during sputtering.

Patent Document 2 describes that a Cu—Se powder, a Cu—In powder, a Cu—Ga powder and a Cu—In—Ga powder are mixed and subject to hot pressing, and lays emphasis on safely producing a target for deposition of a chalcopyrite-type semiconductor, but does not in any way clarify the target structure, film characteristics after being deposited, density, oxygen concentration and other matters.

Moreover, Non-Patent Document 1 discloses a method of producing a CIGS quaternary alloy sputtering target by preparing mechanical alloy powder to become the nanopowder raw material, and thereafter performing HIP (Hot Isostatic Pressing) treatment thereto, and further discloses the characteristics of the obtained target.

Nevertheless, with respect to the characteristics of the CIGS quaternary alloy sputtering target obtained based on the foregoing production method, Non-Patent Document 1 qualitatively describes that the density was high, but fails to clarify any specific numerical values of the density.

Moreover, while it is anticipated that the oxygen concentration is high since nanopowder is being used, Non-Patent Document 1 also fails to clarify the oxygen concentration of the sintered compact. In addition, since expensive nanopowder is being used as the raw material, it is inappropriate as a solar cell material which is demanded of low cost.

Moreover, Non-Patent Document 2 discloses a sintered compact having a composition of $Cu(In_{0.8}Ga_{0.2})Se_2$, density of 5.5 g/cm$^3$, and relative density of 97%. Nevertheless, there is the only description about its production method that the uniquely synthesized raw material powder is sintered via hot press, and the specific production method is not indicated. Moreover, Non-Patent Document 2 also fails to provide any description regarding the oxygen concentration of the obtained sintered compact, target structure, and film characteristics after being deposited.

Non-Patent Document 3 describes technology for preparing a $CuIn_{0.7}Ga_{0.3}Se_2$ alloy sputtering target by subjecting the respective powders of Cu, In, Ga, and Se to mechanical alloying, and additionally performing hot isostatic pressing thereto at 750° C. and 100 MPa. Non-Patent Document 3 describes that the crystal grain size is approximately 50 nm. Nevertheless, Non-Patent Document 3 does not in any way describe the target structure and film characteristics after being sputter-deposited.

Non-Patent Document 4 describes technology for producing a CIGS target by using a powder raw material of $CuIn_{0.72}Ga_{0.28}Se_2$ and subjecting this powder to hot press. Non-Patent Document 4 describes that it is thereby possible to produce a high-density target, and that the structure of this CIGS target contains $Cu_2Se$, $In_2Se_3$, and $Ga_2Se_3$.

Nevertheless, what becomes a problem in the target structure is the existence of numerous heterogenous phases other than the $Cu(In, Ga)Se_2$ phase. The existence of this kind of heterogenous phase structure induces the deterioration of the conversion efficiency. Non-Patent Document 4 has not recognition of this fact.

[Patent Document 1] Japanese Laid-Open Patent Publication No. 2008-163367
[Patent Document 2] Japanese Laid-Open Patent Publication No. 2009-287092
[Non-Patent Document 1] Thin Solid Films 332 (1998) 340-344
[Non-Patent Document 2] November 2009 issue of Electronic Materials, pages 42 to 45
[Non-Patent Document 3] Written by C. Suryanarayana and 4 others, "Synthesis and processing of a Cu—In—Ga—Se sputtering target" Thin Solid Films 332 (1998) 340-344
[Non-Patent Document 4] Written by Zhang Ning and 2 others, "An investigation on preparation of CIGS targets by sintering process", Materials Science and Engineering B 166 (2010) 34-40

SUMMARY OF INVENTION

Technical Problem

An object of this invention is to provide a quaternary alloy sputtering target composed of Cu—In—Ga—Se which is subject to hardly any abnormal discharge even when sputtered for a long period, which is free of any heterogenous phase of $Cu_2Se$ or $Cu(In, Ga)_3Se_5$ which causes the deterioration in the conversion efficiency of the film after being sputter-deposited, and which can produce a film having superior in-plane uniformity. Additionally provided is a target having a predetermined high density.

Solution to Problem

In order to achieve the foregoing objects, as a result of intense study, the present inventors discovered that the deterioration in the conversion efficiency of the film after being sputter-deposited is caused by the existence of a heterogenous phase of $Cu_2Se$ or $Cu(In, Ga)_3Se_5$, and that the existence of this heterogenous phase facilitates the generation of abnormal discharge during sputtering and deteriorates the in-plane uniformity, and further discovered that these problems can be resolved by adjusting the composition ratio of the raw material.

Moreover, the present inventors additionally discovered that the density of the target is associated with the synthesis temperature profile upon preparing the raw material powder and the preset temperature during the hot press. Namely, it was discovered that the target can be highly densified by setting appropriately the synthesis temperature, rate of temperature increase, holding time and so on, and further discovered that the oxygen concentration of the CIGS quaternary alloy sputtering target is associated with the grain size of the raw material powder and the preset temperature of the subsequent process, and it was thereby confirmed that the oxygen concentration of the target can be reduced by using raw material powder having an appropriate average grain size and setting the temperature of the subsequent process at an appropriate temperature.

Specifically, the present invention provides:
1. A quaternary alloy sputtering target composed of copper (Cu), indium (In), gallium (Ga) and selenium (Se), wherein a composition ratio of the respective elements is represented by a formula of $Cu_xIn_{1-y}Ga_ySe_a$ (in the formula, $0.84 \leq x \leq 0.98$, $0 < y \leq 0.5$, $a=(1/2)x+3/2$), and a structure observed via EPMA is configured only from a $Cu(In, Ga)Se_2$ phase without any heterogenous phase of $Cu_2Se$ or $Cu(In, Ga)_3Se_5$.
2. The Cu—In—Ga—Se quaternary alloy sputtering target according to 1 above, wherein a density of the target is 5.5 g/cm³ or more.
3. The Cu—In—Ga—Se quaternary alloy sputtering target according to 1 or 2 above, wherein, in the structure observed via EPMA, an average diameter of an In, Ga agglomeration phase is 100 μm or less.
4. The Cu—In—Ga—Se quaternary alloy sputtering target according to any one of 1 to 3 above, wherein an oxygen concentration is 200 wtppm or less.

Effects of Invention

The CIGS quaternary alloy sputtering target of the present invention yields a superior effect of providing a quaternary alloy sputtering target composed of Cu—In—Ga—Se which is subject to hardly any abnormal discharge even when sputtered for a long period, is free of any heterogenous phase of $Cu_2Se$ or $Cu(In, Ga)_3Se_5$ which causes the deterioration in the conversion efficiency of the film after being sputter-deposited, and can produce a film having superior in-plane uniformity. The present invention yields an additional effect of being able to obtain a high-density target.

DETAILED DESCRIPTION

The quaternary alloy sputtering target composed of Cu—In—Ga—Se according to the present invention is a quaternary alloy sputtering target composed of copper (Cu), indium (In), gallium (Ga) and selenium (Se), wherein a composition ratio of the respective elements is represented by a formula of $Cu_xIn_{1-y}Ga_ySe_a$ (in the formula, $0.84 \leq x \leq 0.98$, $0 < y \leq 0.5$, $a=(1/2)x+3/2$). The component composition of the sputtering target is directly reflected in the film composition after being deposited, and a film having the same component composition as the target is formed.

As evident from this composition ratio, it can be understood that the amount of Cu is lower than the stoichiometric composition that is normally used in CIGS. This fact is extremely important, and considerably affects the conversion efficiency when used as the light-absorbing layer of solar cells, and high conversion efficiency can be consequently obtained. This does not exist in conventional technology.

In the foregoing formula, $0.84 \leq x \leq 0.98$ is optimal, and when x exceeds 0.98 as the upper limit, the conversion efficiency will deteriorate. When the target and sputtering film are observed via EPMA in the foregoing case, a heterogenous phase of $Cu_2Se$ having low resistivity is observed. When this increases, pn-junction becomes impossible, and the conversion efficiency becomes 0.

Meanwhile, in the foregoing formula, $0.84 \leq x \leq 0.98$ is optimal, and when x falls below 0.84 as the lower limit, the conversion efficiency will also deteriorate. When the target and sputtering film are observed via EPMA in the foregoing case, a heterogenous phase of $Cu(In, Ga)_3Se_5$ is observed, and the results are the same as the above case.

As evident from the foregoing explanation, in the sputtering target of the present invention and the sputtering film formed by using the target, it is extremely important that the structure is configured only from a $Cu(In, Ga)Se_2$ phase without any heterogenous phase of $Cu_2Se$ or $Cu(In, Ga)_3Se_5$ in order to improve the conversion efficiency.

Since a heterogenous phase of $Cu_2Se$ or $Cu(In, Ga)_3Se_5$ does not exist in the sputtering target as described above, the abnormal discharge is reduced considerably, and the generation of particles is also reduced. Consequently, it is possible to form a film composed of $Cu_xIn_{1-y}Ga_ySe_a$ (in the formula, $0.84 \leq x \leq 0.98$, $0 < y \leq 0.5$, $a=(1/2)x+3/2$) having a superior in-plane uniformity.

Moreover, it is possible to make the density of the Cu—In—Ga—Se quaternary alloy sputtering target to be 5.5 g/cm³ or more, and this contributes to the prevention of the generation of abnormal discharge and particles.

In addition, when the target structure is observed via EPMA, it can be confirmed that the average diameter of the In, Ga agglomeration phase is 100 μm or less. This similarly yields the effect of preventing the generation of abnormal discharge and particles, and contributes to the in-plane uniformity of the deposited film.

It is further possible to cause the oxygen concentration to be 200 wtppm or less.

One important point regarding the CIGS quaternary alloy sputtering target is that the relative density of the sintered compact is 90% or higher, and preferably 98% or higher. In order to increase the relative density, it is necessary to set the holding temperature during the hot press to be a high and appropriate temperature after preparing the raw material of an appropriate composition ratio. Note that the relative density is the ratio of the value obtained by dividing the actual absolute density of the sintered compact target measured via the Archimedian method by the theoretical density of the target of that composition.

The relative density of the target being low means that there are numerous internal holes in the target, and splashes and abnormal discharge originating around the holes tend to occur upon the exposure of such internal holes during the sputtering. Thus, the generation of particles on the film will increase and the formation of unevenness on the surface will advance quickly, whereby abnormal discharge and the like originating from the surface protrusions (nodules) tend to occur. This is one cause that deteriorates the conversion efficiency of the CIGS solar cells.

Another important point regarding the CIGS quaternary alloy sputtering target of the present invention is that the oxygen content is 200 ppm or less. Thus, it is necessary to prevent the raw material powder from coming into contact with the atmosphere as much as possible, and use raw materials having a grain size that is not too fine. If the oxygen concentration is high, oxygen will bond with the metal components of the CIGS quaternary alloy, and oxides are easily formed. Since oxides have higher electrical resistance than metal, differences in the resistance beyond the level of the resistance variation in a case of single composition will occur on the target face, whereby surface unevenness caused by the abnormal discharge originating from the high-resistance portion and the difference in the sputter rate occurs easily, and may become the cause of the generation of abnormal discharge and particles.

Moreover, the status of abnormal discharge and generation of particles can be examined by processing a GIGS sintered compact, for instance, to have a diameter of 152.4 mm (6 inches) and a thickness of 6 mm, appending brazing fill metal of indium or the like to the backing plate, and sputtering this to observe the actual condition thereof.

EXAMPLES

The Examples and the Comparative Examples of the present invention are now explained. Note that the following Examples merely illustrate representative examples, and the present invention should not be limited to these Examples. Thus, the present invention should be interpreted within the scope of the technical concept that is described in the specification.

Example 1

The composition ratio of the respective elements of a quaternary alloy sputtering target composed of copper (Cu), indium (In), gallium (Ga) and selenium (Se) was within a range of a formula of $Cu_xIn_{1-y}Ga_ySe_a$ (in the formula, $0.84 \leq x \leq 0.98$, $0 < y \leq 0.5$, $a=(1/2)x+3/2$), and, as shown in Table 1, Cu/(In+Ga) was set to 0.84.

These raw materials were placed in a quartz ampule, the inside thereof was vacuumed and thereafter sealed, and it was set in a furnace for synthesis. As the temperature profile, the rate of temperature increase from room temperature to 100° C. was set to 5° C./min, the rate of temperature increase was thereafter set to 1° C./min up to 400° C., the rate of temperature increase was thereafter set to 5° C./min up to 550° C., the rate of temperature increase was thereafter set to 1.66° C./min up to 650° C., and, after being held at 650° C. for 8 hours, the inside of the furnace was cooled back to room temperature for 12 hours.

The CIGS synthetic raw material powder that was obtained as described above was passed through a sieve of 120 mesh, and subject to hot press (HP). The HP conditions were as follows; namely, the rate of temperature increase from room temperature to 750° C. was set to 10° C./min, the temperature was held at 750° C. for 3 hours, the heating was stopped thereafter, and the inside of the furnace was cooled naturally. As the pressure, bearing of 200 kgf/cm² was applied for 2 and a half hours from 30 minutes after reaching 750° C., and the application of pressure was stopped simultaneously with the end of heating.

The density and relative density of the obtained CIGS sintered compact were 5.55 g/cm³ and 98.0%, respectively, and the structure of the target observed via EPMA was configured only from a $Cu(In, Ga)Se_2$ phase without any heterogenous phase of $Cu_2Se$ or $Cu(In, Ga)_3Se_5$. Moreover, the average size of the In, Ga agglomeration phase was 52.2 µm. The foregoing results are shown in Table 1. In addition, the oxygen concentration was 150 ppm.

This sintered compact was processed into a disk-shaped sputtering target having a diameter of 152.4 mm (6") and a thickness of 6 mm, and then sputtering was performed with this target. The sputter power was a direct current (DC) of 1000 W, the atmosphere gas was argon, the gas flow rate was 50 sccm, and the pressure during sputtering was 0.5 Pa. When counting the number of abnormal discharges during one hour from 20 hours to 21 hours after starting sputtering, the result was zero.

Upon observing the component composition and structure of the film after being sputter-deposited, the structure of the film was also configured only from a $Cu(In, Ga)Se_2$ phase without any heterogenous phase of $Cu_2Se$ or $Cu(In, Ga)_3Se_5$. Moreover, the in-plane uniformity was high, and deterioration in the conversion efficiency of the sputter-deposited film could not be acknowledged.

TABLE 1

| Example | x | y | Density (g/cm³) | Relative density (%) | Existence of heterogenous phase | In, Ga condensed phase (µm) | Oxygen concentration (ppm) | Abnormal discharge (times) |
|---|---|---|---|---|---|---|---|---|
| Comparative Example 1 | 0.70 | 0.2 | 5.52 | 95.9 | Yes(P) | 61.4 | 190 | 25 |
| Comparative Example 2 | 0.80 | 0.2 | 5.49 | 95.3 | Yes(P) | 55.7 | 180 | 38 |
| Example 1 | 0.84 | 0.2 | 5.55 | 98.0 | None | 52.2 | 150 | 0 |
| Example 2 | 0.90 | 0.2 | 5.68 | 98.5 | None | 59.8 | 180 | 0 |
| Example 3 | 0.95 | 0.2 | 5.68 | 98.5 | None | 63.4 | 190 | 0 |
| Example 4 | 0.98 | 0.2 | 5.64 | 97.9 | None | 72.3 | 170 | 0 |
| Comparative Example 3 | 1.00 | 0.2 | 5.65 | 98.1 | None | >100 | 980 | 17 |
| Comparative Example 4 | 1.10 | 0.2 | 5.71 | 99.1 | Yes(Q) | >100 | 1350 | 45 |

P: $Cu(In, Ga)_3Se_5$,
Q: $Cu_2Se$

Example 2

With the same method as Example 1, a target of a different composition was prepared. Specifically, in Example 2, the composition ratio of the respective elements of a quaternary alloy sputtering target composed of copper (Cu), indium (In), gallium (Ga) and selenium (Se) was within a range of a formula of $Cu_xIn_{1-y}Ga_ySe_a$ (in the formula, $0.84 \leq x \leq 0.98$, $0 < y \leq 0.5$, $a=(1/2)x+3/2$), and, as shown in Table 1, Cu/(In+Ga) was set to 0.9.

These raw materials were placed in a quartz ampule, the inside thereof was vacuumed and thereafter sealed, and it was set in a furnace for synthesis. As the temperature profile, the rate of temperature increase from room temperature to 100° C. was set to 5° C./min, the rate of temperature increase was thereafter set to 1° C./min up to 400° C., the rate of temperature increase was thereafter set to 5° C./min up to 550° C., the rate of temperature increase was thereafter set to 1.66° C./min up to 650° C., and, after being held at 650° C. for 8 hours, the inside of the furnace was cooled back to room temperature for 12 hours.

The CIGS synthetic raw material powder that was obtained as described above was passed through a sieve of 120 mesh, and subject to hot press (HP). The HP conditions were as follows; namely, the rate of temperature increase from room temperature to 750° C. was set to 10° C./min, the temperature was held at 750° C. for 3 hours, the heating was stopped thereafter, and the inside of the furnace was cooled naturally. As the pressure, bearing of 200 kgf/cm² was applied for 2 and a half hours from 30 minutes after reaching 750° C., and the application of pressure was stopped simultaneously with the end of heating.

The density and relative density of the obtained CIGS sintered compact were 5.68 g/cm³ and 98.5%, respectively, and the structure of the target observed via EPMA was configured only from a $Cu(In, Ga)Se_2$ phase without any heterogenous phase of $Cu_2Se$ or $Cu(In, Ga)_3Se_5$. Moreover, the average size of the In, Ga agglomeration phase was 59.8 µm. The foregoing results are shown in Table 1. In addition, the oxygen concentration was 180 ppm.

This sintered compact was processed into a disk-shaped sputtering target having a diameter of 152.4 mm (6") and a thickness of 6 mm, and then sputtering was performed with this target. The sputter power was a direct current (DC) of 1000 W, the atmosphere gas was argon, the gas flow rate was 50 sccm, and the pressure during sputtering was 0.5 Pa. When counting the number of abnormal discharges during one hour from 20 hours to 21 hours after starting sputtering, the result was zero.

Upon observing the component composition and structure of the film after being sputter-deposited, the structure of the film was also configured only from a $Cu(In, Ga)Se_2$ phase without any heterogenous phase of $Cu_2Se$ or $Cu(In, Ga)_3Se_5$. Moreover, the in-plane uniformity was high, and deterioration in the conversion efficiency of the sputter-deposited film could not be acknowledged.

Example 3

With the same method as Example 1, a target of a different composition was prepared. Specifically, in Example 3, the composition ratio of the respective elements of a quaternary alloy sputtering target composed of copper (Cu), indium (In), gallium (Ga) and selenium (Se) was within a range of a formula of $Cu_xIn_{1-y}Ga_ySe_a$ (in the formula, $0.84 \leq x \leq 0.98$, $0 < y \leq 0.5$, $a=(1/2)x+3/2$), and, as shown in Table 1, Cu/(In+Ga) was set to 0.95.

These raw materials were placed in a quartz ampule, the inside thereof was vacuumed and thereafter sealed, and it was set in a furnace for synthesis. As the temperature profile, the rate of temperature increase from room temperature to 100° C. was set to 5° C./min, the rate of temperature increase was thereafter set to 1° C./min up to 400° C., the rate of temperature increase was thereafter set to 5° C./min up to 550° C., the rate of temperature increase was thereafter set to 1.66° C./min up to 650° C., and, after being held at 650° C. for 8 hours, the inside of the furnace was cooled back to room temperature for 12 hours.

The CIGS synthetic raw material powder that was obtained as described above was passed through a sieve of 120 mesh, and subject to hot press (HP). The HP conditions were as follows; namely, the rate of temperature increase from room temperature to 750° C. was set to 10° C./min, the temperature was held at 750° C. for 3 hours, the heating was stopped thereafter, and the inside of the furnace was cooled naturally. As the pressure, bearing of 200 kgf/cm² was applied for 2 and a half hours from 30 minutes after reaching 750° C., and the application of pressure was stopped simultaneously with the end of heating.

The density and relative density of the obtained CIGS sintered compact were 5.68 g/cm³ and 98.5%, respectively, and the structure of the target observed via EPMA was configured only from a $Cu(In, Ga)Se_2$ phase without any heterogenous phase of $Cu_2Se$ or $Cu(In, Ga)_3Se_5$. Moreover, the average size of the In, Ga agglomeration phase was 63.4 µm. The foregoing results are shown in Table 1. In addition, the oxygen concentration was 190 ppm and the bulk resistance was 65 Ωcm.

This sintered compact was processed into a disk-shaped sputtering target having a diameter of 152.4 mm (6") and a thickness of 6 mm, and then sputtering was performed with this target. The sputter power was a direct current (DC) of 1000 W, the atmosphere gas was argon, the gas flow rate was 50 sccm, and the pressure during sputtering was 0.5 Pa. When counting the number of abnormal discharges during one hour from 20 hours to 21 hours after starting sputtering, the result was zero.

Upon observing the component composition and structure of the film after being sputter-deposited, the structure of the film was also configured only from a $Cu(In, Ga)Se_2$ phase without any heterogenous phase of $Cu_2Se$ or $Cu(In, Ga)_3Se_5$. Moreover, the in-plane uniformity was high, and deterioration in the conversion efficiency of the sputter-deposited film could not be acknowledged.

Example 4

With the same method as Example 1, a target of a different composition was prepared. Specifically, in Example 4, the composition ratio of the respective elements of a quaternary alloy sputtering target composed of copper (Cu), indium (In), gallium (Ga) and selenium (Se) was within a range of a formula of $Cu_xIn_{1-y}Ga_ySe_a$ (in the formula, $0.84 \leq x \leq 0.98$, $0 < y \leq 0.5$, $a=(1/2)x+3/2$), and, as shown in Table 1, Cu/(In+Ga) was set to 0.98.

These raw materials were placed in a quartz ampule, the inside thereof was vacuumed and thereafter sealed, and it was set in a furnace for synthesis. As the temperature profile, the rate of temperature increase from room temperature to 100° C. was set to 5° C./min, the rate of temperature increase was thereafter set to 1° C./min up to 400° C., the rate of temperature increase was thereafter set to 5° C./min up to 550° C., the rate of temperature increase was thereafter set to 1.66° C./min up to 650° C., and, after being held at 650° C. for 8 hours, the inside of the furnace was cooled back to room temperature for 12 hours.

The CIGS synthetic raw material powder that was obtained as described above was passed through a sieve of 120 mesh, and subject to hot press (HP). The HP conditions were as follows; namely, the rate of temperature increase from room temperature to 750° C. was set to 10° C./min, the temperature was held at 750° C. for 3 hours, the heating was stopped thereafter, and the inside of the furnace was cooled naturally. As the pressure, bearing of 200 kgf/cm² was applied for 2 and a half hours from 30 minutes after reaching 750° C., and the application of pressure was stopped simultaneously with the end of heating.

The density and relative density of the obtained CIGS sintered compact were 5.64 g/cm³ and 97.9%, respectively, and the structure of the target observed via EPMA was configured only from a Cu(In, Ga)Se$_2$ phase without any heterogenous phase of Cu$_2$Se or Cu(In, Ga)$_3$Se$_5$. Moreover, the average size of the In, Ga agglomeration phase was 72.3 µm. The foregoing results are shown in Table 1. In addition, the oxygen concentration was 170 ppm.

This sintered compact was processed into a disk-shaped sputtering target having a diameter of 152.4 mm (6") and a thickness of 6 mm, and then sputtering was performed with this target. The sputter power was a direct current (DC) of 1000 W, the atmosphere gas was argon, the gas flow rate was 50 sccm, and the pressure during sputtering was 0.5 Pa. When counting the number of abnormal discharges during one hour from 20 hours to 21 hours after starting sputtering, the result was zero.

Upon observing the component composition and structure of the film after being sputter-deposited, the structure of the film was also configured only from a Cu(In, Ga)Se$_2$ phase without any heterogenous phase of Cu$_2$Se or Cu(In, Ga)$_3$Se$_5$. Moreover, the in-plane uniformity was high, and deterioration in the conversion efficiency of the sputter-deposited film could not be acknowledged.

Comparative Example 1

With the same method as Example 1, a target of a different composition was prepared. Specifically, in Comparative Example 1, the composition ratio of the respective elements of a quaternary alloy sputtering target composed of copper (Cu), indium (In), gallium (Ga) and selenium (Se) was beyond a range of a formula of Cu$_x$In$_{1-y}$Ga$_y$Se$_a$ (in the formula, 0.84≤x≤0.98, 0<y≤0.5, a=(1/2)x+3/2), and, as shown in Table 1, Cu/(In+Ga) was set to 0.7.

These raw materials were placed in a quartz ampule, the inside thereof was vacuumed and thereafter sealed, and it was set in a furnace for synthesis. As the temperature profile, the rate of temperature increase from room temperature to 100° C. was set to 5° C./min, the rate of temperature increase was thereafter set to 1° C./min up to 400° C., the rate of temperature increase was thereafter set to 5° C./min up to 550° C., the rate of temperature increase was thereafter set to 1.66° C./min up to 650° C., and, after being held at 650° C. for 8 hours, the inside of the furnace was cooled back to room temperature for 12 hours.

The GIGS synthetic raw material powder that was obtained as described above was passed through a sieve of 120 mesh, and subject to hot press (HP). The HP conditions were as follows; namely, the rate of temperature increase from room temperature to 750° C. was set to 10° C./min, the temperature was held at 750° C. for 3 hours, the heating was stopped thereafter, and the inside of the furnace was cooled naturally. As the pressure, bearing of 200 kgf/cm² was applied for 2 and a half hours from 30 minutes after reaching 750° C., and the application of pressure was stopped simultaneously with the end of heating.

The density and relative density of the obtained GIGS sintered compact were 5.52 g/cm³ and 95.9%, respectively, and the structure of the target observed via EPMA contained a heterogenous phase of Cu(In, Ga)$_3$Se$_5$. Moreover, the average size of the In, Ga agglomeration phase was 61.4 µm. The foregoing results are shown in Table 1. In addition, the oxygen concentration was 190 ppm.

This sintered compact was processed into a disk-shaped sputtering target having a diameter of 152.4 mm (6") and a thickness of 6 mm, and then sputtering was performed with this target. The sputter power was a direct current (DC) of 1000 W, the atmosphere gas was argon, the gas flow rate was 50 sccm, and the pressure during sputtering was 0.5 Pa. When counting the number of abnormal discharges during one hour from 20 hours to 21 hours after starting sputtering, the result was 25 abnormal discharges.

Upon observing the component composition and structure of the film after being sputter-deposited, the structure of the film also contained a heterogenous phase of Cu(In, Ga)$_3$Se$_5$, and the structure was not configured only from a Cu(In, Ga)Se$_2$ phase. Moreover, the in-plane uniformity was inferior, and the conversion efficiency of the sputter-deposited film deteriorated considerably.

Comparative Example 2

With the same method as Example 1, a target of a different composition was prepared. Specifically, in Comparative Example 2, the composition ratio of the respective elements of a quaternary alloy sputtering target composed of copper (Cu), indium (In), gallium (Ga) and selenium (Se) was beyond a range of a formula of Cu$_x$In$_{1-y}$Ga$_y$Se$_a$ (in the formula, 0.84≤x≤0.98, 0<y≤0.5, a=(1/2)x+3/2), and, as shown in Table 1, Cu/(In+Ga) was set to 0.8.

These raw materials were placed in a quartz ampule, the inside thereof was vacuumed and thereafter sealed, and it was set in a furnace for synthesis. As the temperature profile, the rate of temperature increase from room temperature to 100° C. was set to 5° C./min, the rate of temperature increase was thereafter set to 1° C./min up to 400° C., the rate of temperature increase was thereafter set to 5° C./min up to 550° C., the rate of temperature increase was thereafter set to 1.66° C./min up to 650° C., and, after being held at 650° C. for 8 hours, the inside of the furnace was cooled back to room temperature for 12 hours.

The CIGS synthetic raw material powder that was obtained as described above was passed through a sieve of 120 mesh, and subject to hot press (HP). The HP conditions were as follows; namely, the rate of temperature increase from room temperature to 750° C. was set to 10° C./min, the temperature was held at 750° C. for 3 hours, the heating was stopped thereafter, and the inside of the furnace was cooled naturally. As the pressure, bearing of 200 kgf/cm² was applied for 2 and a half hours from 30 minutes after reaching 750° C., and the application of pressure was stopped simultaneously with the end of heating.

The density and relative density of the obtained CIGS sintered compact were 5.49 g/cm³ and 95.3%, respectively, and the structure of the target observed via EPMA contained a heterogenous phase of Cu(In, Ga)$_3$Se$_5$. Moreover, the average size of the In, Ga agglomeration phase was 55.7 µm. The foregoing results are shown in Table 1. In addition, the oxygen concentration was 180 ppm.

This sintered compact was processed into a disk-shaped sputtering target having a diameter of 152.4 mm (6") and a thickness of 6 mm, and then sputtering was performed with this target. The sputter power was a direct current (DC) of 1000 W, the atmosphere gas was argon, the gas flow rate was 50 sccm, and the pressure during sputtering was 0.5 Pa. When counting the number of abnormal discharges during one hour from 20 hours to 21 hours after starting sputtering, the result was 38 abnormal discharges.

Upon observing the component composition and structure of the film after being sputter-deposited, the structure of the film also contained a heterogenous phase of $Cu(In, Ga)_3Se_5$, and the structure was not configured only from a $Cu(In, Ga)Se_2$ phase. Moreover, the in-plane uniformity was inferior, and the conversion efficiency of the sputter-deposited film deteriorated considerably.

Comparative Example 3

With the same method as Example 1, a target of a different composition was prepared. Specifically, in Comparative Example 3, the composition ratio of the respective elements of a quaternary alloy sputtering target composed of copper (Cu), indium (In), gallium (Ga) and selenium (Se) was beyond a range of a formula of $Cu_xIn_{1-y}Ga_ySe_a$ (in the formula, $0.84 \leq x \leq 0.98$, $0 < y \leq 0.5$, $a=(1/2)x+3/2$), and, as shown in Table 1, Cu/(In+Ga) was set to 1.0.

These raw materials were placed in a quartz ampule, the inside thereof was vacuumed and thereafter sealed, and it was set in a furnace for synthesis. As the temperature profile, the rate of temperature increase from room temperature to 100° C. was set to 5° C./min, the rate of temperature increase was thereafter set to 1° C./min up to 400° C., the rate of temperature increase was thereafter set to 5° C./min up to 550° C., the rate of temperature increase was thereafter set to 1.66° C./min up to 650° C., and, after being held at 650° C. for 8 hours, the inside of the furnace was cooled back to room temperature for 12 hours.

The CIGS synthetic raw material powder that was obtained as described above was passed through a sieve of 120 mesh, and subject to hot press (HP). The HP conditions were as follows; namely, the rate of temperature increase from room temperature to 750° C. was set to 10° C./min, the temperature was held at 750° C. for 3 hours, the heating was stopped thereafter, and the inside of the furnace was cooled naturally. As the pressure, bearing of 200 kgf/cm² was applied for 2 and a half hours from 30 minutes after reaching 750° C., and the application of pressure was stopped simultaneously with the end of heating.

The density and relative density of the obtained CIGS sintered compact were 5.65 g/cm³ and 98.1%, respectively, and the structure of the target observed via EPMA did not contain a heterogenous phase. Moreover, the average size of the In, Ga agglomeration phase exceeded 100 p.m. The foregoing results are shown in Table 1. In addition, the oxygen concentration was 980 ppm.

This sintered compact was processed into a disk-shaped sputtering target having a diameter of 152.4 mm (6") and a thickness of 6 mm, and then sputtering was performed with this target. The sputter power was a direct current (DC) of 1000 W, the atmosphere gas was argon, the gas flow rate was 50 sccm, and the pressure during sputtering was 0.5 Pa. When counting the number of abnormal discharges during one hour from 20 hours to 21 hours after starting sputtering, the result was 17 abnormal discharges.

Upon observing the component composition and structure of the film after being sputter-deposited, the structure of the film also contained a heterogenous phase of $Cu_2Se$, and the structure was not configured only from a $Cu(In, Ga)Se_2$ phase. Moreover, the in-plane uniformity was inferior, and the conversion efficiency of the sputter-deposited film deteriorated considerably.

Comparative Example 4

With the same method as Example 1, a target of a different composition was prepared. Specifically, in Comparative Example 4, the composition ratio of the respective elements of a quaternary alloy sputtering target composed of copper (Cu), indium (In), gallium (Ga) and selenium (Se) was beyond a range of a formula of $Cu_xIn_{1-y}Ga_ySe_a$ (in the formula, $0.84 \leq x \leq 0.98$, $0 < y \leq 0.5$, $a=(1/2)x+3/2$), and, as shown in Table 1, Cu/(In+Ga) was set to 1.1.

These raw materials were placed in a quartz ampule, the inside thereof was vacuumed and thereafter sealed, and it was set in a furnace for synthesis. As the temperature profile, the rate of temperature increase from room temperature to 100° C. was set to 5° C./min, the rate of temperature increase was thereafter set to 1° C./min up to 400° C., the rate of temperature increase was thereafter set to 5° C./min up to 550° C., the rate of temperature increase was thereafter set to 1.66° C./min up to 650° C., and, after being held at 650° C. for 8 hours, the inside of the furnace was cooled back to room temperature for 12 hours.

The CIGS synthetic raw material powder that was obtained as described above was passed through a sieve of 120 mesh, and subject to hot press (HP). The HP conditions were as follows; namely, the rate of temperature increase from room temperature to 750° C. was set to 10° C./min, the temperature was held at 750° C. for 3 hours, the heating was stopped thereafter, and the inside of the furnace was cooled naturally. As the pressure, bearing of 200 kgf/cm² was applied for 2 and a half hours from 30 minutes after reaching 750° C., and the application of pressure was stopped simultaneously with the end of heating.

The density and relative density of the obtained CIGS sintered compact were 5.71 g/cm³ and 99.1%, respectively, and the structure of the target observed via EPMA contained a heterogenous phase of $Cu_2Se$. Moreover, the average size of the In, Ga agglomeration phase exceeded 100 μm. The foregoing results are shown in Table 1. In addition, the oxygen concentration was 1350 ppm.

This sintered compact was processed into a disk-shaped sputtering target having a diameter of 152.4 mm (6") and a thickness of 6 mm, and then sputtering was performed with this target. The sputter power was a direct current (DC) of 1000 W, the atmosphere gas was argon, the gas flow rate was 50 sccm, and the pressure during sputtering was 0.5 Pa. When counting the number of abnormal discharges during one hour from 20 hours to 21 hours after starting sputtering, the result was 45 abnormal discharges.

Upon observing the component composition and structure of the film after being sputter-deposited, the structure of the film also contained a heterogenous phase of $Cu_2Se$, and the structure was not configured only from a $Cu(In, Ga)Se_2$ phase. Moreover, the in-plane uniformity was inferior, and the conversion efficiency of the sputter-deposited film deteriorated considerably.

The CIGS quaternary alloy sputtering target obtained in the present invention is a quaternary alloy sputtering target composed of copper (Cu), indium (In), gallium (Ga) and selenium (Se), wherein a composition ratio of the respective elements is represented by a formula of $Cu_xIn_{1-y}Ga_ySe_a$ (in the formula, $0.84 \leq x \leq 0.98$, $0 < y \leq 0.5$, $a=(1/2)x+3/2$), and a structure observed via EPMA is configured only from a $Cu(In, Ga)Se_2$ phase without any heterogenous phase of $Cu_2Se$ or $Cu(In, Ga)_3Se_5$.

The target is subject to hardly any abnormal discharge even when sputtered for a long period, and is free of any heterogenous phase of $Cu_2Se$ or $Cu(In, Ga)_3Se_5$ which causes the deterioration in the conversion efficiency of the film after being sputter-deposited. Therefore, a film having superior in-plane uniformity can be formed. The present invention additionally obtains a CIGS quaternary alloy sputtering target having a predetermined bulk resistance and a high density.

Moreover, since the density is 98% or higher and the oxygen concentration is 200 wtppm or less, this contributes to the reduction of abnormal discharge and enables the production of a film having a superior in-plane uniformity of the film composition. Thus, the present invention is particularly effective as a light-absorbing layer material of thin-film solar cells, as well as a material of a CIGS quaternary alloy thin film having high conversion efficiency.

The invention claimed is:

1. A Cu—In—Ga—Se quaternary alloy sputtering target consisting of copper, indium, gallium and selenium, wherein the Cu—In—Ga—Se quaternary alloy has a composition expressed by a formula of $Cu_xIn_{1-y}Ga_ySe_a$, where x, y and a satisfy $0.84 \leq x \leq 0.98$, $0 < y \leq 0.5$, and $a=(1/2)x+3/2$ respectively, and a sintered structure which, in observation by EPMA, is configured only from a $Cu(In, Ga)Se_2$ phase without any heterogeneous phase of $Cu_2Se$ or $Cu(In, Ga)_3Se_5$.

2. The Cu—In—Ga—Se quaternary alloy sputtering target according to claim 1, wherein a density of the target is 5.5 g/cm$^3$ or more.

3. The Cu—In—Ga—Se quaternary alloy sputtering target according to claim 2, wherein, in the structure observed via EPMA, an average diameter of an In, Ga agglomeration phase is 100 μm or less.

4. The Cu—In—Ga—Se quaternary alloy sputtering target according to claim 3, wherein an oxygen concentration is 200 wtppm or less.

5. The Cu—In—Ga—Se quaternary alloy sputtering target according to claim 1, wherein, in the structure observed via EPMA, an average diameter of an In, Ga agglomeration phase is 100 μm or less.

6. The Cu—In—Ga—Se quaternary alloy sputtering target according to claim 1, wherein an oxygen concentration is 200 wtppm or less.

7. The Cu—In—Ga—Se quaternary alloy sputtering target according to claim 1, wherein the value of y in the formula $Cu_xIn_{1-y}Ga_ySe_a$ equals 0.2.

8. The Cu—In—Ga—Se quaternary alloy sputtering target according to claim 1, wherein the value of y in the formula $Cu_xIn_{1-y}Ga_ySe_a$ satisfies $0.2 \leq y \leq 0.5$.

* * * * *